(12) United States Patent
Usuda

(10) Patent No.: US 12,183,426 B2
(45) Date of Patent: Dec. 31, 2024

(54) POWER SUPPLY CIRCUIT OF SEMICONDUCTOR DEVICE, SEMICONDUCTOR DEVICE HAVING THE SAME, AND METHOD FOR ADJUSTING OPERATION VOLTAGE OF DEVICE

(71) Applicant: KIOXIA CORPORATION, Tokyo (JP)

(72) Inventor: Masayuki Usuda, Ota Tokyo (JP)

(73) Assignee: Kioxia Corporation, Tokyo (JP)

( * ) Notice: Subject to any disclaimer, the term of this patent is extended or adjusted under 35 U.S.C. 154(b) by 379 days.

(21) Appl. No.: 17/685,941

(22) Filed: Mar. 3, 2022

(65) Prior Publication Data

US 2023/0031820 A1 Feb. 2, 2023

(30) Foreign Application Priority Data

Aug. 2, 2021 (JP) .................. 2021-126907

(51) Int. Cl.
*G11C 7/14* (2006.01)
*G11C 7/06* (2006.01)

(52) U.S. Cl.
CPC .............. *G11C 7/14* (2013.01); *G11C 7/062* (2013.01)

(58) Field of Classification Search
CPC ................... G11C 7/14; G11C 7/062
USPC ................................. 365/244
See application file for complete search history.

(56) References Cited

U.S. PATENT DOCUMENTS

| 2005/0213412 A1* | 9/2005 | Miki ............ G11C 5/145 |
| | | 365/226 |
| 2018/0323703 A1 | 11/2018 | Park et al. |
| 2018/0337663 A1* | 11/2018 | Kwon ............ H03K 5/24 |
| 2023/0273660 A1* | 8/2023 | Han ............ G06F 1/26 |
| | | 307/85 |

FOREIGN PATENT DOCUMENTS

JP 2015-167190 A 9/2015

* cited by examiner

*Primary Examiner* — Connie C Yoha
(74) *Attorney, Agent, or Firm* — Kim & Stewart LLP

(57) ABSTRACT

A power supply circuit of a semiconductor device includes a voltage generation circuit, first and second terminals, and a switch circuit. The voltage generation circuit is configured to generate an operation voltage of the semiconductor device. The first terminal is configured to be at a reference voltage corresponding to an external power supply voltage that is supplied from an external source external to the semiconductor device. The second terminal is connectable to a measuring device. The switch circuit is configured to cause one of the operation voltage and the reference voltage to be output toward the second terminal and then the other of the operation voltage and the reference voltage to be output toward the second terminal.

14 Claims, 8 Drawing Sheets

POWER SUPPLY CIRCUIT OF SEMICONDUCTOR DEVICE, SEMICONDUCTOR DEVICE HAVING THE SAME, AND METHOD FOR ADJUSTING OPERATION VOLTAGE OF DEVICE

CROSS-REFERENCE TO RELATED APPLICATION

This application is based upon and claims the benefit of priority from Japanese Patent Application No. 2021-126907, filed Aug. 2, 2021, the entire contents of which are incorporated herein by reference.

FIELD

Embodiments described herein relate generally to a power supply circuit of a semiconductor device, a semiconductor device having the same, and a method for adjusting an operation voltage of a device.

BACKGROUND

A voltage (i.e., operation voltage) used in a semiconductor device affects an operating speed, power consumption, an element breakdown voltage, and the like of the semiconductor device. Therefore, before products are shipped, output voltages of a voltage reference circuit, a voltage regulator, and the like are measured by a test device, and the operation voltage is adjusted (e.g., trimmed) based on the measured voltages. However, depending on the measurement accuracy of the test device, the voltage adjustment may not be accurately performed

DETAILED DESCRIPTION

Embodiments provide a power supply circuit of a semiconductor device, a semiconductor device, and a method for adjusting an operation voltage of a device that enable high-accuracy measurement and increase voltage correction accuracy.

In general, according to an embodiment, a power supply circuit of a semiconductor device includes a voltage generation circuit, first and second terminals, and a switch circuit. The voltage generation circuit is configured to generate an operation voltage of the semiconductor device. The first terminal is configured to be at a reference voltage corresponding to an external power supply voltage that is supplied from an external source external to the semiconductor device. The second terminal is connectable to a measuring device. The switch circuit is configured to cause one of the operation voltage and the reference voltage to be output toward the second terminal and then the other of the operation voltage and the reference voltage to be output toward the second terminal.

Hereinafter, embodiments of the present disclosure will be described in detail with reference to the drawings.

One or more of the following embodiments are directed to performing accurate correction (trimming) of an operation voltage regardless of voltage measurement accuracy of a test device that performs voltage measurement. In the following embodiments, an example of a power supply circuit of an interface circuit in a memory system will be described. However, the power supply circuit may be applied to another interface circuit or to a circuit other than the interface circuit.

First Embodiment

Configuration of Memory System

Figure 1:
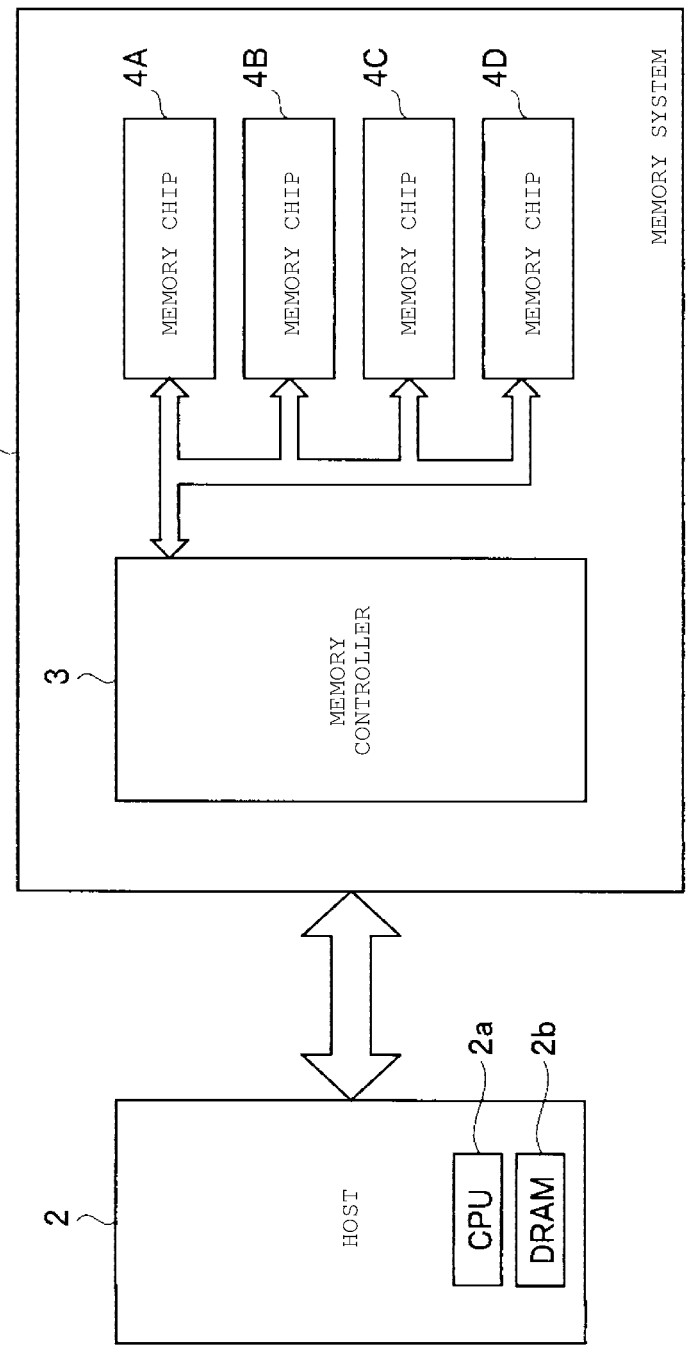
FIG. 1 is a block diagram illustrating a memory system including a semiconductor device according to a first embodiment.
Figure 2:
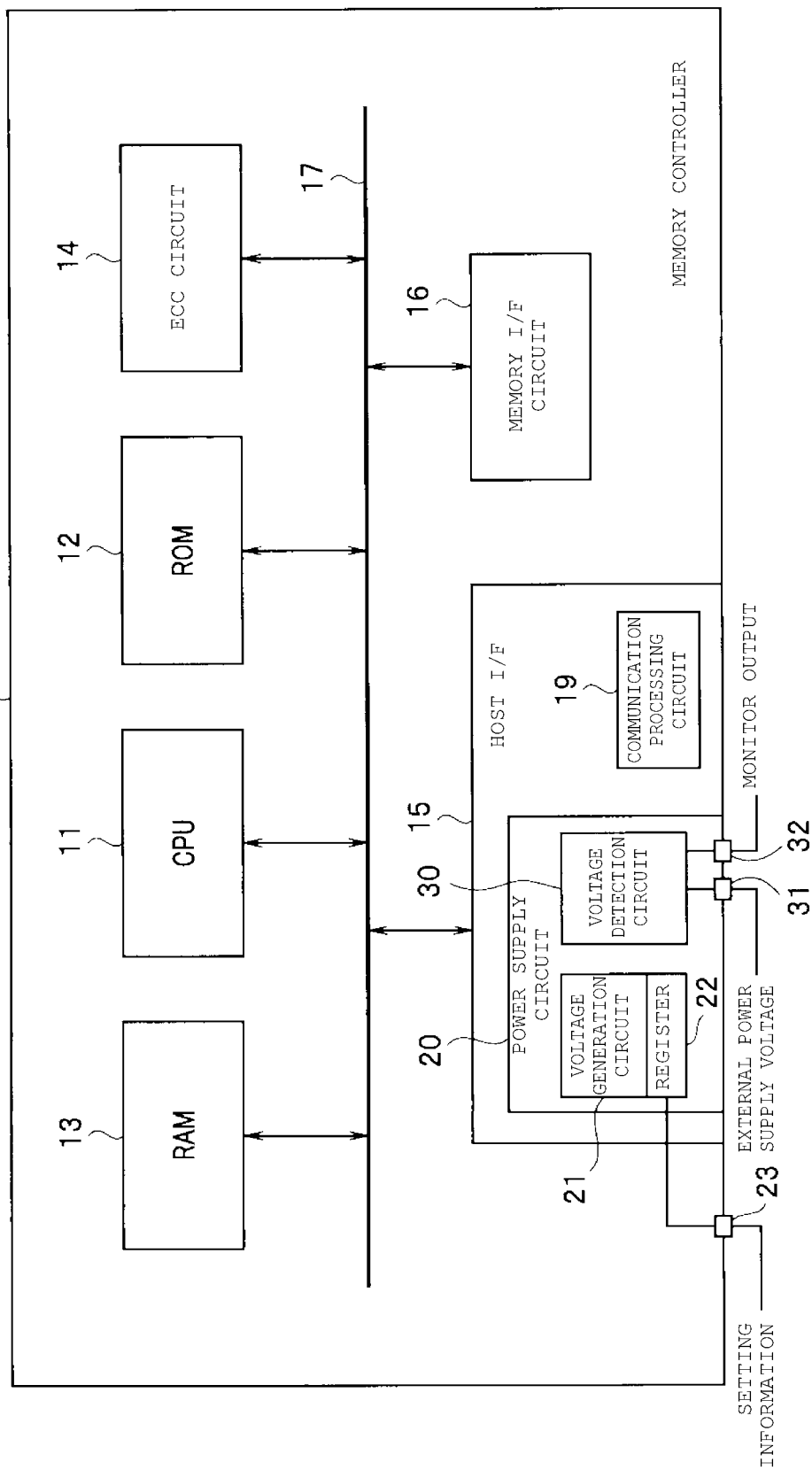
FIG. 2 is a block diagram illustrating an example of a specific configuration of a memory controller in FIG. 1.

FIG. 1 is a block diagram illustrating a memory system including a semiconductor device according to a first embodiment. Further, FIG. 2 is a block diagram illustrating an example of a specific configuration of a memory controller in FIG. 1.

A memory system 1 according to the first embodiment includes a memory controller 3 and four memory chips 4A to 4D. Hereinafter, when there is no need to distinguish between the four memory chips 4A to 4D, the four memory chips are representatively referred to as a memory chip 4. The number of memory chips 4 is not limited to 4, and any number of memory chips of one or more may be adopted.

The memory system 1 can be connected to a host 2. The host 2 is, for example, an electronic device such as a personal computer, a mobile terminal, an in-vehicle device, or a server. The host 2 includes a central processing unit (CPU) 2a as a processor, a ROM (not illustrated), and a DRAM 2b. In response to a request from the host 2, the memory system 1 stores data (hereinafter, simply referred to as data) from the host 2 in each memory chip 4, or reads data stored in each memory chip 4 to output the data to the host 2. Specifically, the memory system 1 can write data to each memory chip 4 in response to a write request from the host 2 and can read data from each memory chip 4 in response to a read request from the host 2.

The memory system 1 may be a universal flash storage (UFS) device or the like in which a memory controller 3 and the plurality of memory chips 4 are configured as one package, or a solid state drive (SSD) or the like. FIG. 1 illustrates a state where the memory system 1 is connected to the host 2.

The memory chip 4 is a semiconductor memory device including a NAND flash memory or the like that non-volatilely stores data. As illustrated in FIG. 1, the memory controller 3 is connected to each memory chip 4 through a NAND bus. The memory controller 3 controls writing of data to the memory chip 4 according to a write request from the host 2. Further, the memory controller 3 controls reading of data from the memory chip 4 according to a read request from the host 2. The memory controller 3 may voluntarily control writing and reading of data to and from the memory chip 4 not by a request from the host 2.

In FIG. 2, the memory controller 3 includes a CPU 11, a ROM 12, a random access memory (RAM) 13, an error check and correct (ECC) circuit 14, a host interface (I/F) circuit 15, and a memory I/F circuit 16. The CPU 11, the ROM 12, the RAM 13, the ECC circuit 14, the host I/F circuit 15, and the memory I/F circuit 16 are connected to each other by an internal bus 17.

The host I/F circuit 15 includes a communication processing circuit 19 that performs a communication process and a power supply circuit 20. The communication processing circuit 19 receives data from the host 2 and outputs a request, write data, or the like included in the received data to the internal bus 17. Further, the communication processing circuit 19 of the host I/F circuit 15 transmits data read from the memory chip 4, a response from the CPU 11, or the like to the host 2. The host 2 also includes an I/F circuit including a communication processing circuit (not illustrated) corresponding to the communication processing circuit 19 of the host I/F circuit 15. The power supply circuit 20 generates a voltage (i.e., operation voltage) used in the communication processing circuit 19 of the host I/F circuit 15.

The host 2 is connected to the host I/F circuit 15 through a predetermined interface. For example, various interfaces such as a parallel interface of embedded multi media card (eMMC), a serial extension interface of peripheral component interconnect-express (PCIe), and a high-speed serial interface of M-PHY are adopted as the interface.

The memory I/F circuit 16 controls a process of writing data or the like to each memory chip 4 and a process of reading data or the like from each memory chip 4 based on an instruction of the CPU 11.

The CPU 11 comprehensively controls the memory controller 3. The CPU 11 configuring a control circuit is, for example, a central processing unit (CPU), a micro processing unit (MPU), or the like. When receiving a request from the host via the host I/F circuit 15, the CPU 11 performs a control according to the request. For example, the CPU 11 instructs the memory I/F circuit 16 to write data to each memory chip 4 according to a request from the host. Further, the CPU 11 instructs the memory I/F circuit 16 to read data from each memory chip 4 according to a request from the host.

The CPU 11 determines a storage region (hereinafter, referred to as a memory region) on each memory chip 4 for data to be stored in the RAM 13. The data is stored into the RAM 13 via the internal bus 17. The CPU 11 determines the memory region for, for example, data of a page unit which is a write unit, that is, page data.

The CPU 11 determines the memory region on each memory chip 4 as a write destination. A physical address is assigned to the memory region of the memory chip 4. The CPU 11 manages the memory region determined as the write destination by using the physical address. The CPU 11 instructs the memory I/F circuit 16 to designate a physical address of the determined memory region and to write data to the memory chip 4. The CPU 11 manages a correspondence between a logical address (logical address managed by the host) of data and a physical address to which the data is written. When receiving a read request including the logical address from the host, the CPU 11 designates a physical address corresponding to the logical address, specifies the physical address, and instructs the memory I/F circuit 16 to read the data.

The ECC circuit 14 encodes data stored in the RAM 13 to generate a code word. Further, the ECC circuit 14 decodes the code word read from each memory chip 4. The RAM 13 temporarily stores data received from the host until the data is stored into each memory chip 4 or temporarily stores data read from each memory chip 4 until the data is transmitted to the host. The RAM 13 is, for example, a general-purpose memory such as a static random access memory (SRAM) or a dynamic random access memory (DRAM).

FIG. 2 illustrates a configuration example in which the memory controller 3 includes the ECC circuit 14 and the memory I/F circuit 16. Alternatively, the ECC circuit 14 may be embedded in the memory I/F circuit 16. Further, the ECC circuit 14 may be embedded in each memory chip 4.

When receiving a write request from the host 2, the memory controller 3 operates as follows. The CPU 11 temporarily stores write data into the RAM 13. The CPU 11 reads the data stored in the RAM 13 and inputs the data to the ECC circuit 14. The ECC circuit 14 encodes the input data and provides a code word to the memory I/F circuit 16. The memory I/F circuit 16 writes the input code word to each memory chip 4.

When receiving a read request from the host 2, the memory controller 3 operates as follows. The memory I/F circuit 16 provides the ECC circuit 14 with a code word read from each memory chip 4. The ECC circuit 14 decodes the input code word and stores the decoded data into the RAM 13. The CPU 11 transmits the data stored in the RAM 13 to the host 2 through the host I/F circuit 15.

Power Supply Circuit

In the present embodiment, the power supply circuit 20 includes a voltage generation circuit 21, a register 22, and a voltage detection circuit 30. The voltage generation circuit 21 may include a regulator or a voltage reference circuit and generates a particular voltage. The register stores setting information for adjusting a voltage generated by the voltage generation circuit 21. The voltage generation circuit 21 generates the voltage based on the setting information stored in the register 22.

The voltage detection circuit 30 receives the voltage output from the voltage generation circuit 21 and receives an external power supply voltage through a terminal 31 as a first terminal. The voltage detection circuit 30 outputs a monitor output for detecting a voltage generated by the voltage generation circuit 21 with high accuracy from a terminal 32 as a second terminal.

Figure 4:
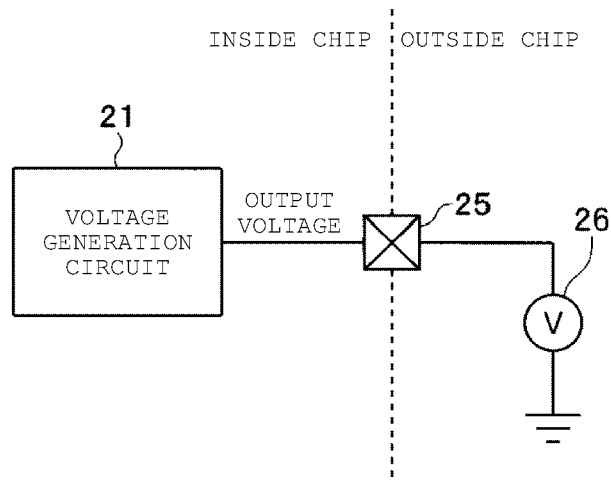
FIG. 4 is a circuit diagram illustrating a comparative example of voltage measurement.

FIG. 4 is a circuit diagram illustrating a comparative example of voltage measurement.

In the comparative example of FIG. 4, a voltage from the voltage generation circuit 21 is output through a terminal 25. A voltage measurer 26 is connected to the terminal 25, and the voltage measurer 26 measures the voltage output from the voltage generation circuit 21 and then supplied through the terminal 25.

Now, the output voltage of the voltage generation circuit 21 is defined as Vout. Assuming that the voltage measurer 26 has a measurement error $\Delta V$, a measurement result of the voltage measurer 26 is Vout+$\Delta V$. When the output voltage of the voltage generation circuit 21 is adjusted based on the measurement result including the measurement error $\Delta V$, a desirable voltage cannot be obtained.

To address such an issue, in the present embodiment, voltage measurement is performed using a high-accuracy reference voltage, which is set to a voltage value with high accuracy.

Figure 3:
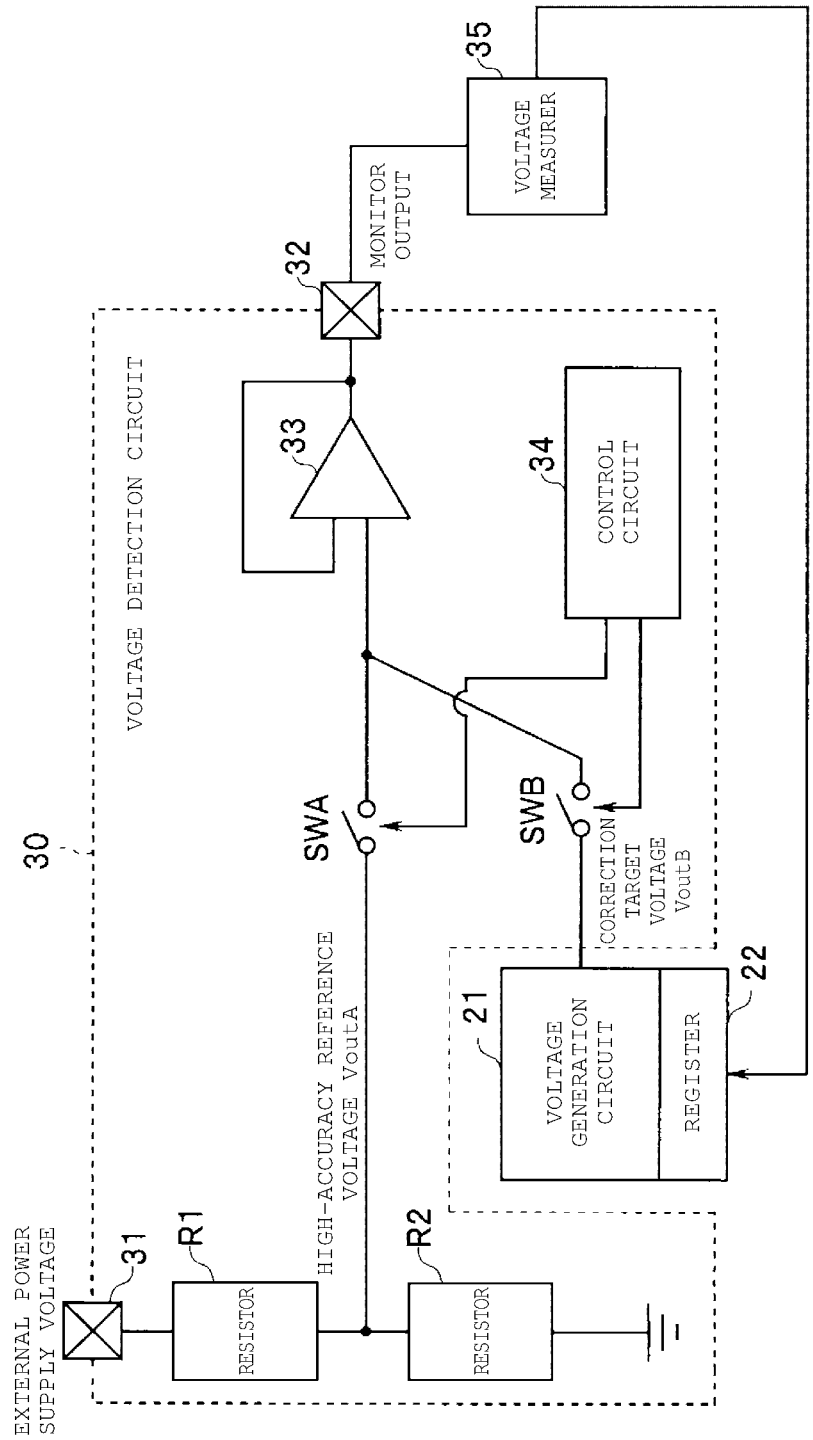
FIG. 3 is a circuit diagram illustrating an example of a specific configuration of a power supply circuit in FIG. 1.

FIG. 3 is a circuit diagram illustrating an example of a specific configuration of the power supply circuit 20 in FIG. 1.

The voltage generation circuit 21 may include a regulator or a voltage reference circuit and receives a voltage (not illustrated) to generate a specified operation voltage. The register 22 stores setting information of the voltage generation circuit 21. The voltage generation circuit 21 operates according to the setting information stored in the register 22. By changing the setting information in the register 22, a voltage generated by the voltage generation circuit 21 can be adjusted or changed. An output of the voltage generation circuit 21 is supplied to one input terminal of a buffer amplifier 33 through a switch SWB as a correction target voltage VoutB.

An external power supply voltage is applied to the terminal 31. The external power supply voltage has a voltage value with sufficiently high accuracy. A resistor R1 and a resistor R2 are connected in series between the terminal 31 and a reference voltage point. The resistors R1 and R2 can be set to a resistance ratio with sufficiently high accuracy. A high-accuracy reference voltage VoutA having a voltage value with sufficiently high accuracy based on a voltage value of the external power supply voltage and resistance values of the resistors R1 and R2 is generated at a connection point (e.g., terminal) of the resistors R1 and R2 as a reference voltage acquisition circuit. The connection point of the resistors R1 and R2 is connected to the one input terminal of the buffer amplifier 33 through a switch SWA.

A control circuit 34 may be a processor using a CPU, a field programmable gate array (FPGA), or the like. The control circuit 34 may operate according to a program stored in a memory (not illustrated) to control each unit, or may be a hardware electronic circuit that implements part or all of functions thereof. The control circuit 34 controls each unit of the power supply circuit 20. The control circuit 34 controls turn-on and turn-off of the switches SWA and SWB. The switches SWA and SWB may be configured with transistors.

The control circuit 34 turns on one of the switches SWA and SWB, thereby providing the one input terminal of the buffer amplifier 33 to be at one of the correction target voltage VoutB and the high-accuracy reference voltage VoutA. An output terminal of the buffer amplifier 33 is connected to the other input terminal, and a voltage supplied to the one input terminal is output from the output terminal. An output of the buffer amplifier 33 is supplied from the terminal 32 to a voltage measurer 35 as a monitor output. That is, a monitor output based on the correction target voltage VoutB and a monitor output based on the high-accuracy reference voltage VoutA are switched and supplied to the voltage measurer 35.

The voltage measurer 35 measures a voltage value of the monitor output. For example, a test device for testing a semiconductor device may be adopted as the voltage measurer 35. The voltage measurer 35 may include a CPU, a memory, and the like (not illustrated) to execute a test program. The voltage measurer 35 may measure voltage values of the monitor output based on the correction target voltage VoutB and the monitor output based on the high-accuracy reference voltage VoutA by executing the test program, and may be configured to change setting information stored in the register 22 such that a difference between two voltage values matches a specified value.

Operation

Figure 5:
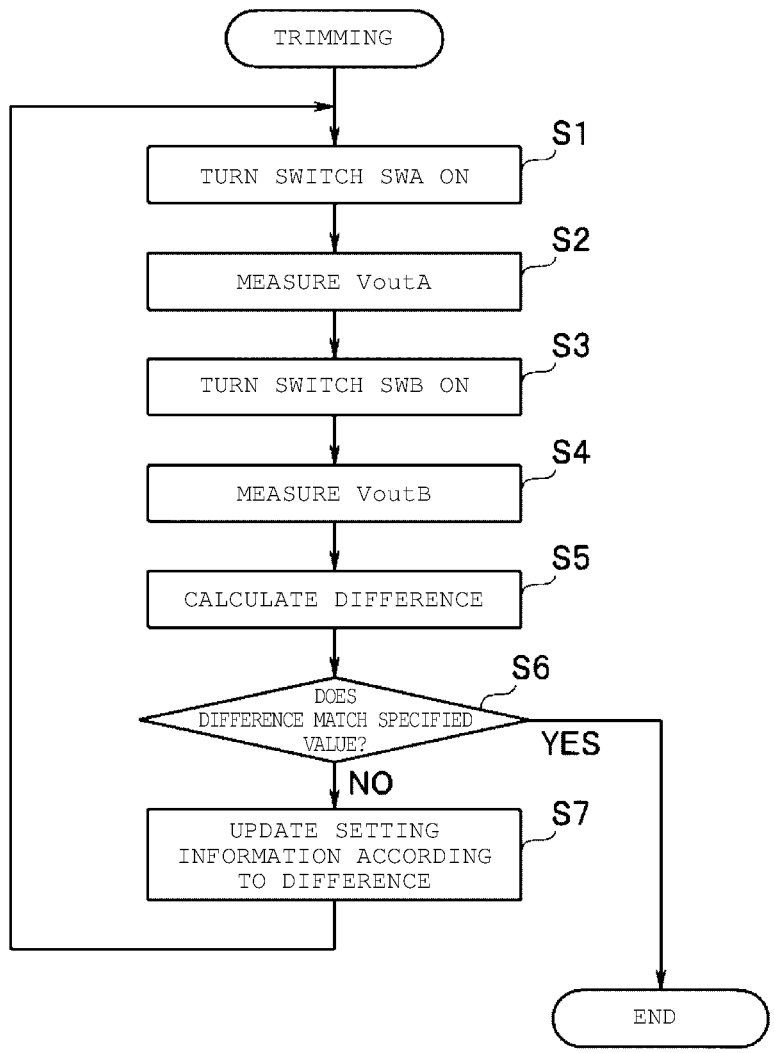
FIG. 5 is a flowchart illustrating a trimming operation of an output voltage according to the first embodiment.

Next, a trimming operation using the power supply circuit according to the first embodiment configured as such will be described with reference to FIG. 5. FIG. 5 is a flowchart illustrating a trimming operation of an output voltage according to the first embodiment.

When trimming an output voltage of the voltage generation circuit 21, an external power supply voltage is supplied to the terminal 31. Further, the voltage measurer 35 is connected to the terminal 32. In this state, the control circuit 34 turns the switch SWA on and turns the switch SWB off (S1 of FIG. 5). The external power supply voltage supplied to the terminal 31 is divided by the resistors R1 and R2, and the high-accuracy reference voltage VoutA appears at the connection point of the resistors R1 and R2. The high-accuracy reference voltage VoutA is supplied to the one input terminal of the buffer amplifier 33 through the switch SWA. The buffer amplifier 33 outputs the input high-accuracy reference voltage VoutA to the terminal 32 as a monitor output. The voltage measurer 35 measures a voltage of the monitor output of the terminal 32 and obtains a measurement result (S2).

Next, the control circuit 34 turns the switch SWA off and turns the switch SWB on (S3). The voltage generation circuit 21 generates an output voltage based on setting information stored in the register 22. An output voltage of the voltage generation circuit 21 is supplied to the one input terminal of the buffer amplifier 33 through the switch SWB as the correction target voltage VoutB. The buffer amplifier 33 outputs the input correction target voltage VoutB to the terminal 32 as a monitor output. The voltage measurer 35 measures a voltage of the monitor output of the terminal 32 and obtains a measurement result (S4).

Now, a measurement error (offset) in the voltage measurer 35 is defined as $\Delta V$. In this case, the voltage measurer 35 obtains $VoutA+\Delta V$ as a measurement result for the high-accuracy reference voltage VoutA. Further, the voltage measurer 35 obtains $VoutB+\Delta V$ as a measurement result for the correction target voltage VoutB. The voltage measurer 35 obtains a difference between the measurement results to cancel a measurement error (S5). A difference calculation result is $VoutA+\Delta V-VoutB-\Delta V=VoutA-VoutB$.

The measurement error is cancelled in the difference calculation result, and an accurate difference between the correction target voltage VoutB of the voltage generation circuit 21 and the high-accuracy reference voltage VoutA is found from the difference calculation result. Since the voltage value of the high-accuracy reference voltage VoutA has high accuracy, the correction target voltage VoutB can be corrected with high accuracy by using the difference calculation result. For example, the voltage measurer 35 operates according to a program for trimming, and when the difference calculation result does not match a specified value (NO in S6), a signal indicating setting information is generated based on the difference calculation result and output to the register 22. The setting information stored in the register 22 is updated to the one indicated by the signal from the voltage measurer 35 (S7).

When the setting information is updated based on the difference calculation result in the register 22, the voltage generation circuit 21 generates the correction target voltage VoutB of a voltage value based on the updated setting information. Thereafter, processes of step S1 to step S7 are repeated until the difference calculation result matches the specified value.

When the difference calculation result matches the specified value, the correction target voltage VoutB is assumed to reach a desirable voltage value, and the setting information in the register 22 is fixed, and the trimming process ends (YES in S6).

When the control circuit 34 and the voltage measurer 35 can operate in cooperation with each other, the trimming process can be automated.

As such, according to the present embodiment, a voltage measurement error of a test device that performs voltage measurement can be cancelled by using a high-accuracy reference voltage based on an external power supply voltage. This enables highly accurate voltage measurement and reliable trimming of the output voltage.

Second Embodiment

Figure 6:
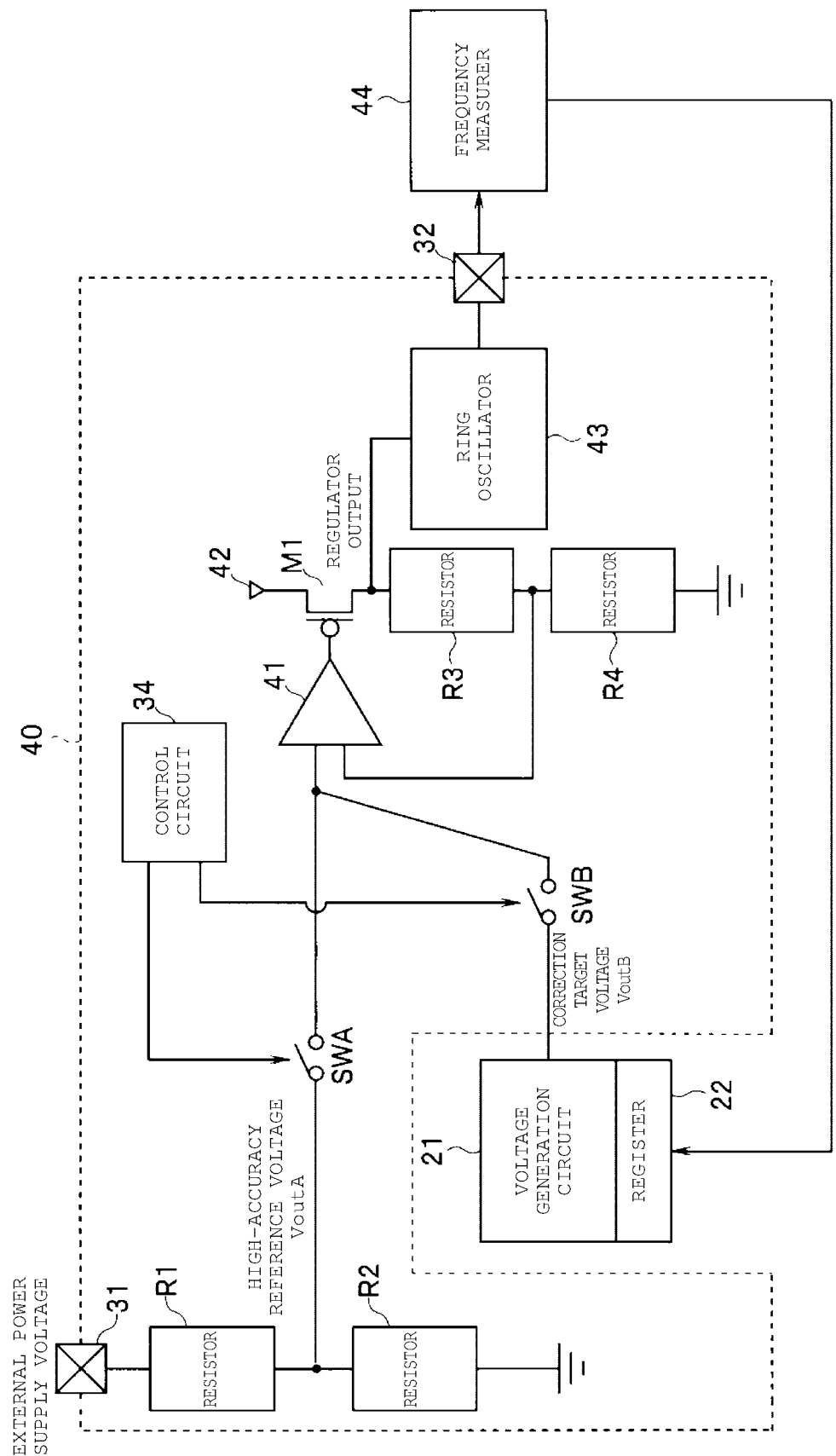
FIG. 6 is a circuit diagram illustrating a power supply circuit according to a second embodiment.

FIG. 6 is a circuit diagram illustrating a power supply circuit according to a second embodiment. In FIG. 6, the same components as in FIG. 3 are designated by the same reference numerals, and descriptions thereof are omitted.

In the first embodiment, a voltage value of a monitor output is obtained by the voltage measurer 35. In the second embodiment, a voltage detection circuit 40 generates oscillation signals having frequencies corresponding to output voltages and trimming is carried out by performing frequency measurement instead of voltage measurement. In general, to increase frequency measurement accuracy is often easier than to increase voltage measurement accuracy.

The high-accuracy reference voltage VoutA is input to a positive input terminal of an amplifier 41 configuring a regulator through the switch SWA. The correction target voltage VoutB is input to the positive input terminal of the amplifier 41 through the switch SWB. An output terminal of the amplifier 41 is connected to a gate of a PMOS transistor M1. The transistor M1 has a source connected to a power supply terminal 42, the gate to which the output of the amplifier 41 is applied, and a drain connected to one terminal of a resistor R3. The other terminal of the resistor R3 is connected to a reference voltage point through a resistor R4. A connection point of the resistors R3 and R4 are connected to a negative input terminal of the amplifier 41.

A voltage corresponding to the output of the amplifier 41 is generated at the drain of the transistor M1. The voltage (drain voltage) generated at the drain of the transistor M1 is divided by the resistors R3 and R4. A voltage appearing at the connection point of the resistors R3 and R4 is fed back to the negative input terminal of the amplifier 41.

The amplifier 41 drives the transistor M1 based on a difference between a voltage supplied to the positive input terminal and a voltage supplied to the negative input terminal. Thereby, the transistor M1 generates a drain current that changes according to the voltage applied to the positive input terminal of the amplifier 41.

A regulator including the amplifier 41, the transistor M1, and the resistors R3 and R4 functions as a buffer and has a function of changing a high-accuracy reference voltage VoutA to a voltage according to a voltage of a voltage generation circuit 21.

The drain current of the transistor M1 is supplied to a ring oscillator 43 as a regulator output. The ring oscillator 43 oscillates at a frequency corresponding to the drain current of the transistor M1 and outputs an oscillation clock (may be referred to as an oscillation signal) to a terminal 32 as a monitor output. A frequency measurer 44 is connected to the terminal 32. The frequency measurer 44 may be, for example, a test device for testing a semiconductor device, and measures a frequency of the monitor output. The frequency measurer 44 outputs a signal indicating setting information based on a measurement result to a register 22.

The frequency measurer 44 may include a CPU, a memory, and the like, which are not illustrated, to execute a test program. The frequency measurer 44 may be configured to measure a frequency of the monitor output corresponding to the correction target voltage VoutB and a frequency of the monitor output corresponding to the high-accuracy reference voltage VoutA by executing the test program, and change setting information in the register 22 such that a difference between the two frequencies matches a specified value.

Figure 7:
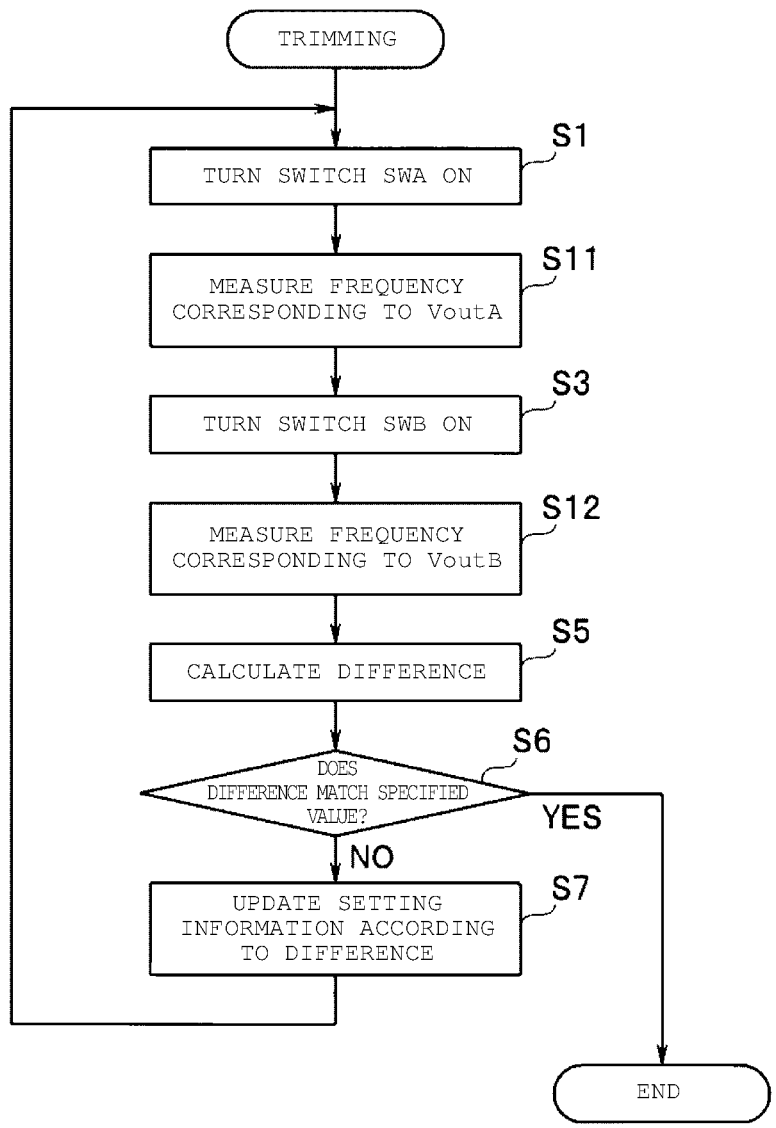
FIG. 7 is a flowchart illustrating a trimming operation of an output voltage according to the second embodiment.

Next, a trimming operation using the power supply circuit according to the second embodiment configured as such will be described with reference to FIG. 7. FIG. 7 is a flowchart illustrating a trimming operation of an output voltage according to the second embodiment. In FIG. 7, the same procedure as in FIG. 5 is designated by the same reference numeral and description thereof is omitted.

The present embodiment differs from the flowchart of FIG. 5 in that step S11 and step S12 of performing frequency measurement are respectively carried out instead of step S2 and step S4 of performing voltage measurement.

When trimming an output voltage of the voltage generation circuit 21, an external power supply voltage is supplied to the terminal 31. Further, the frequency measurer 44 is connected to the terminal 32. In this state, the control circuit 34 turns the switch SWA on and turns the switch SWB off (S1 of FIG. 7). Thereby, the high-accuracy reference voltage VoutA is input to the amplifier 41 through the switch SWA. The amplifier 41 drives the transistor M1 based on the input high-accuracy reference voltage VoutA, and the drain current of the transistor M1 becomes a current corresponding to the high-accuracy reference voltage VoutA. This current is supplied to the ring oscillator 43, and the ring oscillator 43 outputs an oscillation signal at a frequency corresponding to the high-accuracy reference voltage VoutA to the terminal 32 as a monitor output. The frequency measurer 44 measures a frequency of the monitor output of the terminal 32 and obtains a measurement result (S11).

Next, the control circuit 34 turns the switch SWA off and turns the switch SWB on (S3). Thereby, the correction target voltage VoutB from the voltage generation circuit 21 is input to the amplifier 41 through the switch SWB. The amplifier 41 drives the transistor M1 based on the input correction target voltage VoutB, and the transistor M1 supplies the drain current corresponding to the correction target voltage VoutB to the ring oscillator 43. The ring oscillator 43 outputs an oscillation signal at a frequency corresponding to the correction target voltage VoutB to the terminal 32 as a monitor output. The frequency measurer 44 measures a frequency of the monitor output of the terminal 32 and obtains a measurement result (S12).

A measurement error is included in both the measurement result based on the high-accuracy reference voltage VoutA and the measurement result based on the correction target voltage VoutB. The frequency measurer 44 offsets the measurement error by obtaining a difference between the two measurement results. When a difference result of the frequency measurer 44 does not match a specified value, a signal indicating setting information based on the difference result is sent to the register 22 and the stored setting information is updated to the one indicated by the signal. Thereby, the voltage generation circuit 21 generates an output voltage according to the updated setting information.

Thereafter, the frequency measurement based on the high-accuracy reference voltage VoutA and the frequency measurement based on the correction target voltage VoutB are repeated until the difference result matches the specified value. When the difference result matches the specified value, the setting information in the register 22 is fixed. By doing so, the output voltage of the voltage generation circuit 21 can be trimmed to a desirable voltage.

As such, according to the present embodiment, the same effect as in the first embodiment can be achieved. Further, according to the present embodiment, an oscillation signal of an arbitrary frequency can be obtained by adjusting a voltage of the correction target voltage VoutB based on a voltage of the high-accuracy reference voltage VoutA with a regulator. Thereby, there is an advantage that an external power supply voltage of various values can be used.

When the control circuit 34 and the frequency measurer 44 can operate in cooperation with each other, a trimming process can be automated.

Third Embodiment

Figure 8:
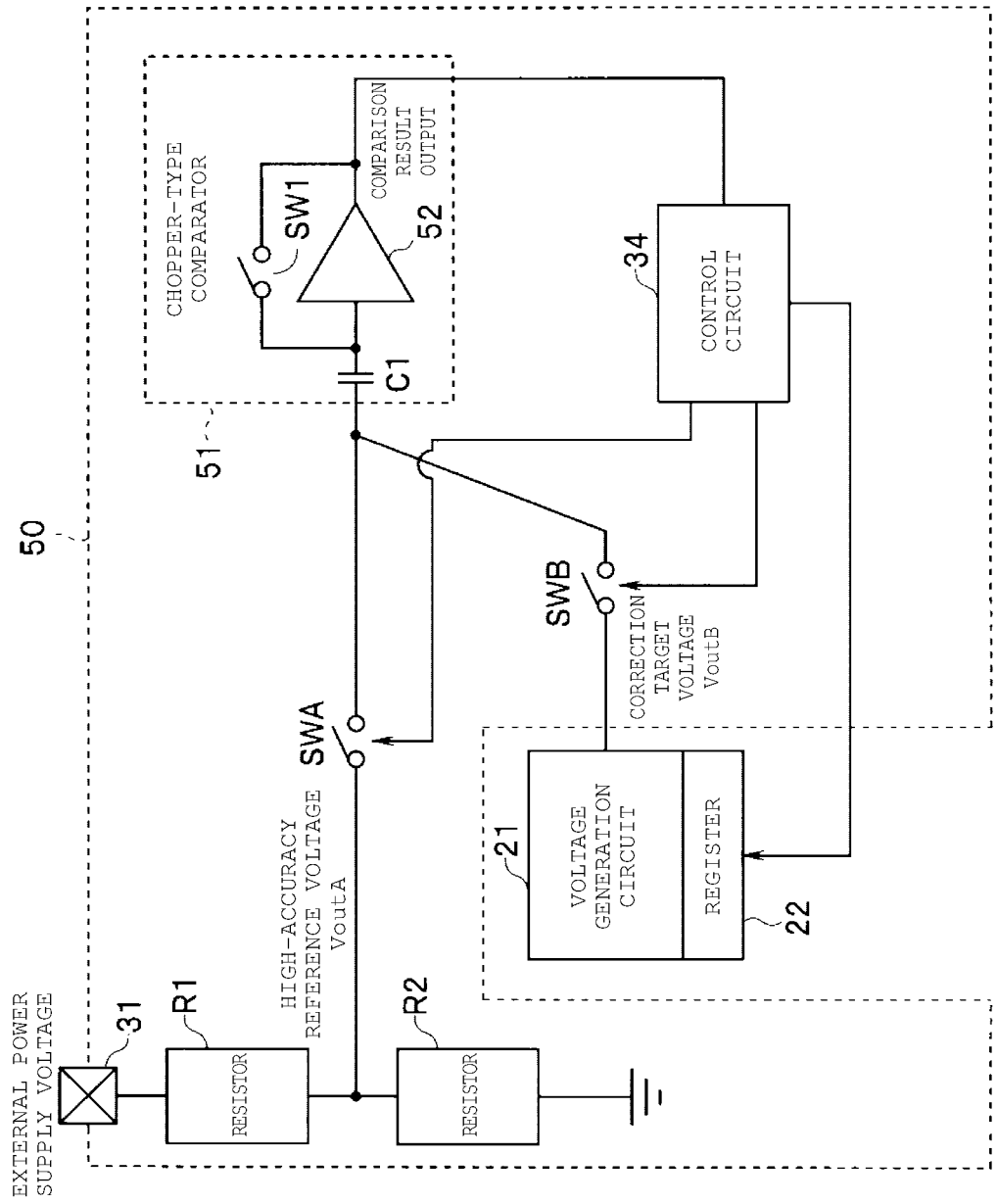
FIG. 8 is a circuit diagram illustrating a power supply circuit according to a third embodiment.

FIG. 8 is a circuit diagram illustrating a power supply circuit according to a third embodiment. In FIG. 8, the same components as in FIG. 3 are designated by the same reference numerals, and descriptions thereof are omitted.

In the present embodiment, a voltage detection-correction circuit 50 capable of executing not only voltage detection but also trimming is employed instead of the voltage detection circuit 30 employed in the first embodiment. The voltage detection-correction circuit 50 includes an embedded circuit for voltage measurement.

The high-accuracy reference voltage VoutA is supplied to a chopper-type comparator 51 through the switch SWA, and the correction target voltage VoutB is supplied to the chopper-type comparator 51 through the switch SWB. The chopper-type comparator 51 includes a capacitor C1, an inverter 52, and a switch SW1. The high-accuracy reference voltage VoutA and the correction target voltage VoutB are input to an input terminal of the inverter 52 through the capacitor C1. The input terminal and an output terminal of the inverter 52 are connected to each other through the switch SW1. The switch SW1 may be configured with a transistor.

The switch SW1 is controlled to be turned on or off by the control circuit 34 (not illustrated). The switch SW1 is turned on in synchronization with the switch SWA and is turned off when the switch SWB is turned on. The control circuit 34 first turns the switch SWA on and then turns the switch SWB off. Thereby, the high-accuracy reference voltage VoutA is supplied to one electrode of the capacitor C1. Since the switch SW1 is also turned on in synchronization with turn-on of the switch SWA, a voltage of the other electrode of the capacitor C1 is the same as a threshold voltage Vth (an input voltage that causes an input voltage and an output voltage of the inverter 52 to be the same) of the inverter 52. Thereby, the capacitor C1 is set in a state where a voltage of VoutA−Vth is charged. This state is defined as an initialization state of the chopper-type comparator 51.

Next, the control circuit 34 turns the switch SWA off and turns the switch SWB on. Thereby, the correction target voltage VoutB is supplied to the one electrode of the capacitor C1. Immediately after the correction target voltage VoutB is supplied to the capacitor, a terminal voltage of the capacitor C1 is maintained at a voltage of VoutA−Vth. When the correction target voltage VoutB is input to the one electrode of the capacitor C1, a voltage of the other electrode of the capacitor C1 becomes a voltage of VoutB−VoutA+Vth. Thus, a comparison output voltage of the inverter 52 becomes a high level (hereinafter, referred to as an H level) when VoutA>VoutB, and becomes a low level (hereinafter, referred to as an L level) when VoutB>VoutA. As such, the chopper-type comparator 51 compares the high-accuracy reference voltage VoutA with the correction target voltage VoutB, and outputs an output voltage (comparison result output) indicating a comparison result.

An output of the chopper-type comparator 51 is supplied to the control circuit 34. The control circuit 34 can update setting information in the register 22. The control circuit 34 changes the setting information in the register 22 such that an output voltage of the voltage generation circuit 21 gradually increases or decreases. The control circuit 34 determines from the output of the chopper-type comparator 51 that the output voltage (that is, VoutB) of the voltage generation circuit 21 changes according to the setting information and the correction target voltage VoutB from the voltage generation circuit 21 reaches the high-accuracy reference voltage VoutA. For example, the control circuit 34 determines that a point in time when the output of the chopper-type comparator 51 changes from an L level to an H level or from an H level to an L level is a point in time when the correction target voltage VoutB matches the high-accuracy reference voltage VoutA, and that the setting information at this time is determined as setting information for obtaining a desirable output voltage.

Figure 9:
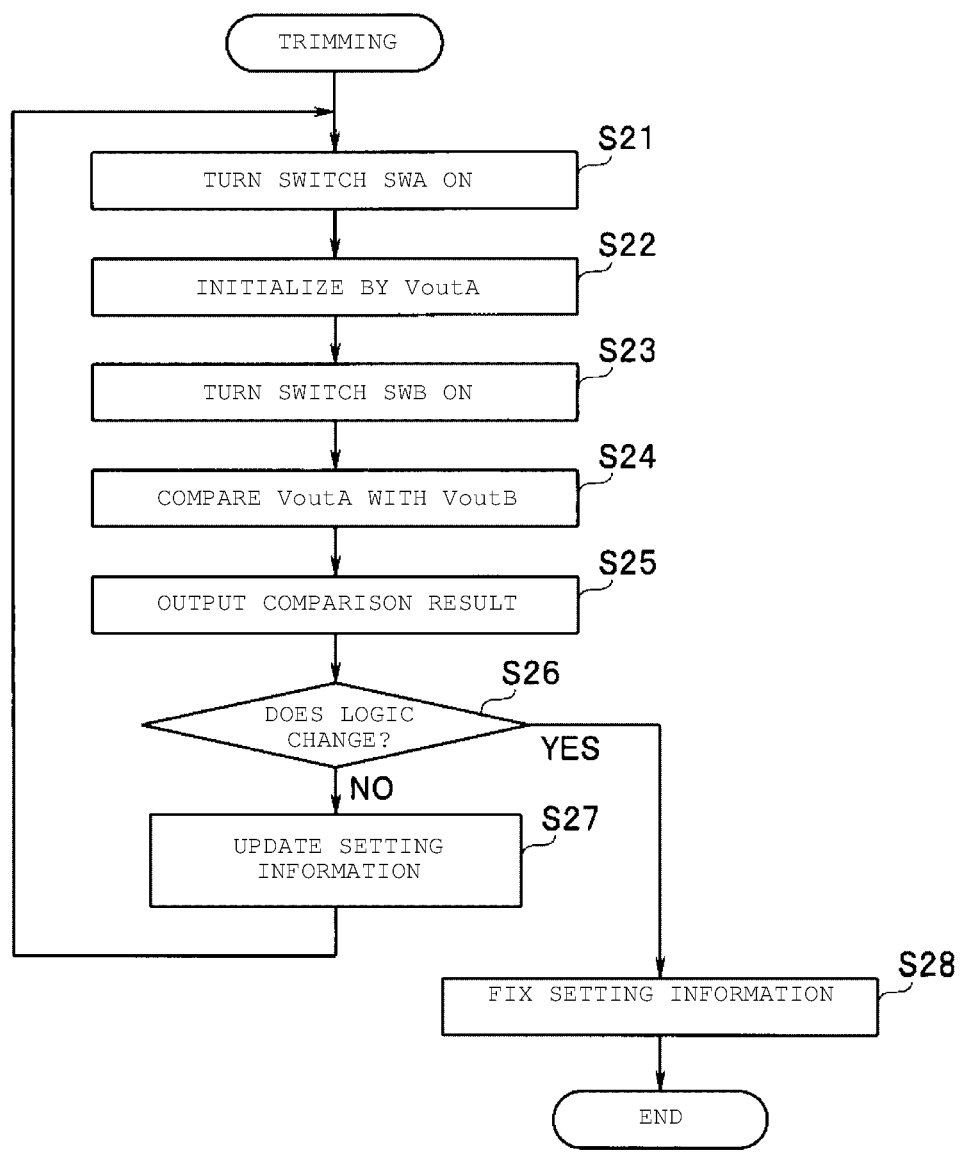
FIG. 9 is a flowchart illustrating a trimming operation of an output voltage according to the third embodiment.

Next, a trimming operation using the power supply circuit according to the third embodiment configured as such will be described with reference to FIG. 9. FIG. 9 is a flowchart illustrating a trimming operation of an output voltage according to the third embodiment.

When trimming the output voltage of the voltage generation circuit 21, an external power supply voltage is supplied to the terminal 31. The control circuit 34 turns the switch SWA on and turns the switch SWB off (S21 of FIG. 9). Thereby, the high-accuracy reference voltage VoutA is applied to the one electrode of the capacitor C1 of the chopper-type comparator 51 through the switch SWA. At this timing, the switch SW1 also turns on, voltages of an input terminal and an output terminal of the inverter 52 are the same as each other, and the voltage of the input terminal of the inverter 52 becomes the threshold voltage Vth of the inverter 52. Thus, in this case, the capacitor C1 is in a state of being charged with a voltage of VoutA−Vth (S22).

Next, the control circuit 34 turns the switch SWA off and turns the switch SWB on (S23). Thereby, the correction target voltage VoutB from the voltage generation circuit 21 is input to the chopper-type comparator 51 through the switch SWB. In the capacitor C1 of the chopper-type comparator 51, the correction target voltage VoutB is input to the one electrode, and thereby, a voltage of the other electrode becomes a voltage of VoutB−VoutA+Vth. Then, a comparison output voltage of the inverter 52 goes to a level according to a comparison of the high-accuracy reference voltage VoutA and the correction target voltage VoutB. That is, the chopper-type comparator 51 compares VoutA and VoutB, and an output of the chopper-type comparator 51 goes to an H level when VoutA>VoutB and goes to an L level when VoutA<VoutB.

A comparison result output is supplied to the control circuit 34. The control circuit 34 determines whether or not a logic of a comparison result output of previous time and current time is inverted (S26). The control circuit 34 updates setting information in the register 22 when the logic of the comparison result output is not inverted (NO in S26). The control circuit 34 repeatedly determines whether or not the logic of the comparison result output is inverted (S26) while changing the setting information in the register 22 such that the output voltage of the voltage generation circuit 21 gradually increases or decreases (S27).

When the correction target voltage VoutB reaches the high-accuracy reference voltage VoutA from a voltage higher than the high-accuracy reference voltage VoutA, or when the correction target voltage VoutB reaches the high-accuracy reference voltage VoutA from a voltage lower than the high-accuracy reference voltage VoutA, the logic of the comparison result output is inverted when reaching the voltage. The control circuit 34 determines that the correction target voltage VoutB reaches the high-accuracy reference voltage VoutA when the logic of the comparison result output is inverted. That is, the control circuit 34 fixes the setting information in the register 22 assuming that a desirable output voltage is obtained from the setting information currently stored in the register 22.

As such, according to the present embodiment the same effect as in the first embodiment can be achieved. Further, according to the present embodiment, since a voltage is measured by an embedded chopper-type comparator, not only the trimming but also the voltage measurement can be automated.

In the respective embodiments described above, an example is described in which a high-accuracy reference voltage is obtained by resistance-dividing an external power supply voltage. Alternatively, a high-accuracy reference voltage may be an external power supply voltage supplied from a terminal.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A power supply circuit of a semiconductor device comprising:
    a voltage generation circuit configured to generate an operation voltage of the semiconductor device;
    a first terminal configured to be at a reference voltage corresponding to an external power supply voltage that is supplied from an external source external to the semiconductor device;
    a second terminal connectable to an external measuring device that is external to the semiconductor device; and
    a switch circuit configured to cause one of the operation voltage and the reference voltage to be output toward the second terminal and then the other of the operation voltage and the reference voltage to be output toward the second terminal, wherein
    the switch circuit includes a first switch element disposed in a first wiring through which the operation voltage generated by the voltage generation circuit is supplied toward the second terminal, a second switch element disposed in a second wiring through which the reference voltage is supplied toward the second terminal, and a control circuit configured to turn on and off the first and second switch elements.

2. The power supply circuit according to claim 1, wherein the operation voltage and the reference voltage are output from the second terminal.

3. The power supply circuit according to claim 1, further comprising:
    a register configured such that setting information stored therein is modifiable by a signal external from the semiconductor device,
    wherein the voltage generation circuit is configured to generate the operation voltage based on the setting information stored in the register.

4. The power supply circuit according to claim 1, further comprising:
    an oscillator configured to generate a first oscillation signal oscillating at a first frequency corresponding to the operation voltage and a second oscillation signal oscillating at a second frequency corresponding to the reference voltage.

5. The power supply circuit according to claim 4, wherein the first and second oscillation signals are output from the second terminal.

6. A semiconductor memory device comprising:
    a semiconductor memory; and
    a memory controller configured to control writing and reading with respect to the semiconductor memory, the memory controller including the power supply circuit according to claim 1, the memory controller being the semiconductor device.

7. A method for adjusting an operation voltage of a device including a voltage generation circuit configured to generate the operation voltage based on setting information, a first terminal configured to be at a reference voltage corresponding to an external power supply voltage that is supplied from an external source external to the device, a second terminal, and a switch circuit including a first switch element disposed in a first wiring through which the operation voltage is supplied toward the second terminal and a second switch element disposed in a second wiring through which the reference voltage is supplied toward the second terminal, the method comprising:
    switching on the first switch element and off the second switch element, to output the operation voltage to the second terminal;
    switching off the first switch element and on the second switch element, to output the reference voltage to the second terminal;
    measuring a difference of the operation voltage output from the second terminal and the reference voltage output from the second terminal with an external measuring device that is external to the device and connected to the second terminal; and
    modifying the setting information based on the measured difference.

8. The method according to claim 7, wherein said measuring comprises:
    measuring the operation voltage output from the second terminal;
    measuring the reference voltage output from the second terminal; and
    calculating a difference of the measured operation voltage and the measured reference voltage.

9. The method according to claim 7, wherein
    the setting information is stored in a register included in the device, and
    said modifying comprises sending a signal from the external voltage measuring device to the register based on the measured difference.

10. The method according to claim 9, wherein the signal is sent when the difference is different from a predetermined value.

11. A method for adjusting an operation voltage of a device including a voltage generation circuit configured to generate the operation voltage based on setting information, a first terminal configured to be at a reference voltage corresponding to an external power supply voltage that is supplied from an external source external to the device, and a second terminal, the method comprising:
    outputting a first oscillation signal oscillating at a first frequency corresponding to the operation voltage to the second terminal;

outputting a second oscillation signal oscillating at a second frequency corresponding to the reference voltage to the second terminal;

measuring a difference of the first frequency of the output first oscillation signal and the second frequency of the output second oscillation signal; and modifying the setting information based on the measured difference.

12. The method according to claim 11, wherein said measuring is carried out with an external frequency measuring device that is external to the device and connected to the second terminal.

13. A power supply circuit of a semiconductor device comprising:

a voltage generation circuit configured to generate an operation voltage of the semiconductor device;

a first terminal configured to be at a reference voltage corresponding to an external power supply voltage that is supplied from an external source external to the semiconductor device;

a second terminal connectable to a measuring device;

a switch circuit configured to cause one of the operation voltage and the reference voltage to be output toward the second terminal and then the other of the operation voltage and the reference voltage to be output toward the second terminal; and an oscillator configured to generate a first oscillation signal oscillating at a first frequency corresponding to the operation voltage and a second oscillation signal oscillating at a second frequency corresponding to the reference voltage.

14. The power supply circuit according to claim 13, wherein the first and second oscillation signals are output from the second terminal.

* * * * *